United States Patent
Sugita et al.

(10) Patent No.: US 8,932,707 B2
(45) Date of Patent: Jan. 13, 2015

(54) HARD FILM AND HARD FILM COATED TOOL

(75) Inventors: Hiroaki Sugita, Toyokawa (JP); Takamasa Suzuki, Toyokawa (JP)

(73) Assignee: OSG Corporation, Toyokawa-shi (JP)

( * ) Notice: Subject to any disclaimer, the term of this patent is extended or adjusted under 35 U.S.C. 154(b) by 273 days.

(21) Appl. No.: 13/505,923

(22) PCT Filed: Nov. 12, 2009

(86) PCT No.: PCT/JP2009/069296
§ 371 (c)(1),
(2), (4) Date: May 3, 2012

(87) PCT Pub. No.: WO2011/058636
PCT Pub. Date: May 19, 2011

(65) Prior Publication Data
US 2012/0213990 A1  Aug. 23, 2012

(51) Int. Cl.
*B23B 27/14* (2006.01)
*C23C 14/06* (2006.01)

(52) U.S. Cl.
CPC .................................. *C23C 14/0688* (2013.01)
USPC ............... 428/336; 51/307; 51/309; 428/697; 428/698; 428/699

(58) Field of Classification Search
USPC ............. 51/307, 309; 428/336, 697, 698, 699
See application file for complete search history.

(56) References Cited

U.S. PATENT DOCUMENTS

| 6,824,601 B2 * | 11/2004 | Yamamoto et al. ........... 428/699 |
| 7,226,670 B2 * | 6/2007 | Derflinger et al. ............ 428/697 |
| 7,504,149 B2 * | 3/2009 | Toihara et al. ................ 428/698 |
| 2003/0148146 A1 | 8/2003 | Kubota et al. |
| 2004/0018393 A1 | 1/2004 | Fukui et al. |
| 2005/0276990 A1 | 12/2005 | Kohara et al. |
| 2006/0269789 A1 | 11/2006 | Toihara et al. |

(Continued)

FOREIGN PATENT DOCUMENTS

| CN | A 101445928 | 6/2009 |
| JP | 07-205361 | 8/1995 |

(Continued)

OTHER PUBLICATIONS

Jan. 12, 2010 International Search Report issued in International Application No. PCT/JP2009/069296.

(Continued)

*Primary Examiner* — Archene Turner
(74) *Attorney, Agent, or Firm* — Oliff PLC (57) ABSTRACT

A hard film excellent in abrasion resistance and heat resistance includes: a first film consisting of $Al_aCr_b(SiC)_c\alpha_dN$, where α denotes one or more elements of groups IVa, Va, VIa (except Cr) of the periodic table, B, C, Si, and Y; a b, c, and d are atom ratios within ranges of $0.35 \le a \le 0.76$, $0.12 \le b \le 0.43$, $0.05 \le c \le 0.20$, and $0 \le d \le 0.20$, respectively; an atom ratio b/a of Cr to Al is within a range of $0.25 \le b/a \le 0.67$; and $a+b+c+d=1$ is satisfied. The first film disposed on a top surface, the hard film having a total thickness Ttotal within a range of 0.5 μm to 15 μm with a thickness T1 of the first film or, if another film portion having the same film components as the first film is included, a thickness including the film thickness T1 and the another film portion accounting for 20% or more of the total thickness Ttotal.

10 Claims, 11 Drawing Sheets

(56) References Cited

U.S. PATENT DOCUMENTS

| | | |
|---|---|---|
| 2009/0173625 A1 | 7/2009 | Kohara et al. |
| 2009/0214894 A1 | 8/2009 | Kohara et al. |

FOREIGN PATENT DOCUMENTS

| | | |
|---|---|---|
| JP | A-10-025566 | 1/1998 |
| JP | A-2000-308906 | 11/2000 |
| JP | 2001-293601 * | 10/2001 |
| JP | A-2002-160129 | 6/2002 |
| JP | A-2003-25113 | 1/2003 |
| JP | A-2004-42192 | 2/2004 |
| JP | A-2004-130514 | 4/2004 |
| JP | A-2004-238736 | 8/2004 |
| JP | A-2006-307323 | 11/2006 |
| JP | A-2006-336032 | 12/2006 |
| JP | A-2007-2332 | 1/2007 |
| JP | A-2007-15106 | 1/2007 |
| JP | A-2007-119795 | 5/2007 |
| JP | A-2008-093760 | 4/2008 |

OTHER PUBLICATIONS

Jan. 20, 2014 Office Action issued in Chinese Patent Application No. 200980162436.8 (with Partial English Translation).

* cited by examiner

FIG.2(a)
AlCr(SiC)N

FIG.2(b)
AlCrSiCN

FIG.2(c)
FILM CHARACTERISTICS OF AlCrSiCN

FIG.6(a)
TEST CONDITION

| TOOL SHAPE | HIGH-SPEED STEEL SQUARE END MILL $\phi$ 10 |
|---|---|
| WORK MATERIAL | S50C |
| CUTTING SPEED | 37 m/min (1178 min$^{-1}$) |
| FEED SPEED | 0.081 mm/t (190 mm/min) |
| CUTTING METHOD | SIDE SURFACE CUTTING |
| DEPTH OF CUT | aa = 5 mm |
| | ar = 9 mm |
| CUTTING FLUID | OILY |

FIG.6(b)
SIDE SURFACE CUTTING

FIG.7

| TEST SAMPLE | HARD FILM (SINGLE LAYER OF FIRST FILM) | | | | | | | | | | | Cr/Al RATIO | TOTAL FILM THICKNESS (μm) | FILM HARDNESS (Hv0.025) | OXIDATION LAYER THICKNESS (μm) | CUTTING DISTANCE (m) | JUDGMENT | REMARKS |
|---|---|---|---|---|---|---|---|---|---|---|---|---|---|---|---|---|---|---|
| | Al | Cr | SiC | B | C | Si | α | | | | | | | | | | | |
| | | | | | | | Y | Zr | V | Nb | W | | | | | | | |
| No01 | 70.0 | 30.0 | 0.0 | | | | | | | | | 0.43 | 0.2 | 2510 | TOTAL OXIDATION | 6.3 | × | CONVENTIONAL SAMPLE |
| No02 | 70.0 | 30.0 | 0.0 | | | | | | | | | 0.43 | 0.5 | 2660 | TOTAL OXIDATION | 8.6 | × | CONVENTIONAL SAMPLE |
| No03 | 70.0 | 30.0 | 0.0 | | | | | | | | | 0.43 | 3.1 | 2810 | 1.10 | 9.5 | × | CONVENTIONAL SAMPLE |
| No04 | 67.9 | 29.3 | 2.8 | | | | | | | | | 0.43 | 2.9 | 3050 | 0.82 | 9.7 | × | NG SAMPLE |
| No05 | 66.3 | 28.4 | 5.3 | | | | | | | | | 0.43 | 3.3 | 3160 | 0.52 | 16.5 | ○ | SAMPLE OF PRESENT INVENTION |
| No06 | 63.1 | 27.1 | 9.8 | | | | | | | | | 0.43 | 2.8 | 3190 | 0.38 | 17.3 | ○ | SAMPLE OF PRESENT INVENTION |
| No07 | 59.1 | 25.3 | 15.6 | | | | | | | | | 0.43 | 0.2 | 3270 | TOTAL OXIDATION | 6.2 | × | NG SAMPLE |
| No08 | 59.1 | 25.3 | 15.6 | | | | | | | | | 0.43 | 0.5 | 3270 | 0.35 | 12.2 | ○ | SAMPLE OF PRESENT INVENTION |
| No09 | 59.1 | 25.3 | 15.6 | | | | | | | | | 0.43 | 3.1 | 3270 | 0.34 | 17.8 | ○ | SAMPLE OF PRESENT INVENTION |
| No10 | 59.1 | 25.3 | 15.6 | | | | | | | | | 0.43 | 5.5 | 3270 | 0.36 | 16.2 | ○ | SAMPLE OF PRESENT INVENTION |
| No11 | 54.2 | 36.1 | 9.7 | | | | | | | | | 0.67 | 14.3 | 3210 | 0.35 | 14.8 | ○ | SAMPLE OF PRESENT INVENTION |
| No12 | 59.1 | 25.3 | 15.6 | | | | | | | | | 0.43 | 19.0 | 3270 | 0.32 | 7.2 | × | NG SAMPLE |
| No13 | 56.1 | 24.1 | 19.8 | | | | | | | | | 0.43 | 3.5 | 3290 | 0.32 | 16.8 | ○ | SAMPLE OF PRESENT INVENTION |
| No14 | 53.1 | 22.7 | 24.2 | | | | | | | | | 0.43 | 3.2 | 3320 | 0.33 | 8.2 | × | NG SAMPLE |
| No15 | 55.3 | 23.7 | 11.2 | | | | | | | 9.8 | | 0.43 | 2.8 | 3240 | 0.24 | 17.2 | ○ | SAMPLE OF PRESENT INVENTION |
| No16 | 55.8 | 23.9 | 9.9 | | | | | | | | 10.4 | 0.43 | 2.9 | 3190 | 0.25 | 17 | ○ | SAMPLE OF PRESENT INVENTION |
| No17 | 56.2 | 23.4 | 12.3 | | | | | | 8.1 | | | 0.42 | 3.1 | 3220 | 0.22 | 16.7 | ○ | SAMPLE OF PRESENT INVENTION |
| No18 | 58.5 | 25.2 | 11.3 | 5 | | | | | | | | 0.43 | 3.1 | 3290 | 0.22 | 16.3 | ○ | SAMPLE OF PRESENT INVENTION |
| No19 | 54.2 | 36.1 | 9.7 | | | | | | | | | 0.67 | 2.8 | 3090 | 0.30 | 16.8 | ○ | SAMPLE OF PRESENT INVENTION |
| No20 | 51.5 | 34.3 | 14.2 | | | | | | | | | 0.67 | 3.2 | 3280 | 0.30 | 16.2 | ○ | SAMPLE OF PRESENT INVENTION |
| No21 | 48.5 | 32.3 | 19.2 | | | | | | | | | 0.67 | 2.8 | 3170 | 0.30 | 17.1 | ○ | SAMPLE OF PRESENT INVENTION |
| No22 | 68.2 | 17.1 | 14.7 | | | | | | | | | 0.25 | 3.2 | 3290 | 0.30 | 16.2 | ○ | SAMPLE OF PRESENT INVENTION |
| No23 | 72.3 | 12.7 | 15.0 | | | | | | | | | 0.18 | 3.0 | 3350 | 0.33 | 5.3 | × | NG SAMPLE |
| No24 | 52.6 | 22.5 | 9.9 | 4.6 | | | | | | | 10.4 | 0.43 | 3.0 | 3290 | 0.24 | 15.2 | ○ | SAMPLE OF PRESENT INVENTION |
| No25 | 52.6 | 22.6 | 14.3 | 5.3 | | | | | | | 5.2 | 0.43 | 3.2 | 3270 | 0.26 | 14.1 | ○ | SAMPLE OF PRESENT INVENTION |
| No26 | 45.4 | 44.2 | 10.4 | | | | | | | | | 0.97 | 2.8 | 2850 | 0.33 | 9.2 | × | NG SAMPLE |

FIG.8(a)

TEST CONDITION

| TOOL SHAPE | CEMENTED CARBIDE TWO-BLADED BALL END MILL R3 |
|---|---|
| WORK MATERIAL | SKD61(50HRC) |
| CUTTING SPEED | 150 m/min (8000 min⁻¹) |
| FEED SPEED | 0.1 mm/t (1600 mm/min) |
| CUTTING METHOD | PICK MILLING |
| DEPTH OF CUT | aa = 0.2 mm |
| | Pf = 0.4 mm |
| CUTTING FLUID | AIR BLOW |

FIG.8(b)

PICK MILLING

FIG.9

| TEST SAMPLE | FIRST FILM (SURFACE LAYER) | | | | | | | | | | | Cr/Al RATIO | SECOND FILM (UNDERLYING LAYER) | | | | | | | | | | | FILM THICKNESS (μm) | | | TOTAL FILM THICKNESS |
|---|---|---|---|---|---|---|---|---|---|---|---|---|---|---|---|---|---|---|---|---|---|---|---|---|---|---|---|
| | Al | Cr | SiC | B | C | Si | Y | Zr | V | Nb | W | | Ti | Al | Cr | B | C | Si | Y | Zr | V | Nb | W | FIRST | SECOND | INTERLAYER | |
| | | | | | | α | | | | | | | | | | | | β | | | | | | | | | |
| No27 | 70.0 | 30.0 | 0.0 | | | | | | | | | 0.43 | 37.1 | 44.7 | 18.2 | | | | | | | | | 1.1 | 1.9 | — | 3.0 |
| No28 | 59.1 | 25.3 | 15.6 | | | | | | | | | 0.43 | 37.1 | 44.7 | 18.2 | | | | | | | | | 1.0 | 1.8 | — | 2.8 |
| No29 | 59.6 | 25.6 | 14.8 | | | | | | | | | 0.43 | 29.5 | 57.0 | 13.5 | | | | | | | | | 0.9 | 2.3 | — | 3.2 |
| No30 | 59.7 | 25.6 | 14.7 | | | | | | | | | 0.43 | 28.4 | 58.5 | 13.1 | | | | | | | | | 0.2 | 3.1 | — | 3.3 |
| No31 | 60.3 | 25.8 | 13.9 | | | | | | | | | 0.43 | 29.3 | 58.2 | 12.5 | | | | | | | | | 0.2 | 2.5 | — | 2.7 |
| No32 | 59.4 | 25.5 | 15.1 | | | | | | | | | 0.43 | 26.8 | 60.1 | 13.1 | | | | | | | | | 0.5 | 2.4 | — | 2.9 |
| No33 | 59.6 | 25.6 | 14.8 | | | | | | | | | 0.43 | 27.4 | 57.9 | 14.7 | | | | | | | | | 2.3 | 2.2 | — | 4.5 |
| No34 | 59.6 | 25.6 | 14.8 | | | | | | | | | 0.43 | 28.2 | 57.6 | 14.2 | | | | | | | | | 3.1 | 2.2 | — | 5.3 |
| No35 | 60.1 | 25.7 | 14.2 | | | | | | | | | 0.43 | 29.3 | 56.8 | 13.9 | | | | | | | | | 3.2 | 4.4 | — | 7.6 |
| No36 | 60.8 | 26.1 | 13.1 | | | | | | | | | 0.43 | 27.6 | 58.3 | 14.1 | | | | | | | | | 4.5 | 8.2 | — | 12.7 |
| No37 | 59.6 | 25.6 | 14.8 | | | | | | | | | 0.43 | 28.3 | 58.1 | 13.6 | | | | | | | | | 6.2 | 12.3 | — | 18.5 |
| No38 | 59.4 | 25.4 | 15.2 | | | | | | | | | 0.43 | 21.9 | 69.3 | 8.8 | | | | | | | | | 1.1 | 2.2 | — | 3.3 |
| No39 | 60.5 | 25.9 | 13.6 | | | | | | | | | 0.43 | 29.5 | 57.0 | 13.5 | | | | | | | | | 0.8 | 1.8 | — | 2.9 |
| No40 | 59.4 | 25.4 | 15.2 | | | | | | | | | 0.43 | 28.0 | 54.0 | 12.8 | 5.2 | | | | | | | | 0.8 | 1.9 | — | 2.7 |
| No41 | 60.8 | 26.0 | 13.2 | | | | | | | | | 0.43 | 26.8 | 51.7 | 12.2 | | | | | | | | | 1.2 | 1.9 | — | 3.1 |
| No42 | 59.6 | 25.6 | 14.8 | | | | | | | | | 0.43 | 51.2 | 48.8 | | | | | | | | | | 1.1 | 2.1 | — | 3.2 |
| No43 | 60.1 | 25.7 | 14.2 | | | | | | | | | 0.43 | 42.4 | 57.6 | | | | | | | | | | 1.2 | 2.3 | — | 3.5 |
| No44 | 59.4 | 25.5 | 15.1 | | | | | | | | | 0.43 | | 67.1 | 32.9 | | | | | | | | | 0.8 | 2.2 | — | 3.0 |
| No45 | 58.7 | 25.1 | 16.2 | | | | | | | | | 0.43 | | 56.2 | 38.8 | | | | | | | | | 1.0 | 2.0 | — | 3.0 |
| No46 | 56.2 | 23.4 | 12.2 | | | | | | 8.2 | | | 0.42 | 37.1 | 45.2 | 17.7 | | | | | | | | | 0.9 | 1.9 | — | 2.8 |
| No47 | 61.0 | 25.5 | 7.5 | | | | | | | 6 | | 0.42 | 23.8 | 61.9 | 9.5 | | | | | | | | | 1.1 | 1.9 | 0.5 | 3.5 |
| No48 | 57.1 | 24.6 | 10.3 | | | | | | 8 | | | 0.43 | 30.1 | 55.2 | 14.7 | | | | | | | | | 0.9 | 1.9 | — | 2.8 |
| No49 | 57.2 | 23.5 | 11.6 | | | | | | 7.7 | | | 0.41 | 23.7 | 65.7 | 7.4 | | | | | | | | | 1.2 | 2.3 | — | 3.5 |
| No50 | 53.3 | 22.8 | 9.2 | 5.3 | | | | | | | 9.4 | 0.43 | 36.5 | 46.1 | 17.4 | | | | | | | | | 1.0 | 2.2 | — | 3.2 |
| No51 | 52.2 | 22.4 | 9.5 | 4.7 | | | | | | | 11.2 | 0.43 | 27.5 | 60.5 | 10.0 | | | | | | | | | 1.1 | 1.8 | — | 2.9 |
| No52 | 52.2 | 22.4 | 10.5 | 4.8 | | | | | | | 10.1 | 0.43 | 19.4 | 71.2 | 9.4 | | | | | | | | | 1.1 | 2.1 | — | 3.2 |
| No53 | 59.1 | 25.3 | 15.6 | | | | | | | | | 0.43 | 35.0 | 42.6 | 18.2 | | 2 | | | | | | | 1.0 | 1.8 | 0.5 | 3.3 |
| No54 | 62.2 | 26.6 | 9.2 | | 2 | | | | | | | 0.43 | 25.7 | 64.2 | 10.1 | | | | | | | | | 1.3 | 1.4 | — | 2.7 |
| No55 | 58.4 | 31.5 | 7.3 | | 2.8 | | | | | | | 0.54 | 21.9 | 69.3 | 8.8 | | | | | | | | | 1.4 | 2.1 | 0.3 | 3.8 |
| No56 | 57.1 | 26.9 | 10.7 | | | | 5.3 | | | | | 0.47 | 36.5 | 46.1 | 17.4 | | | | | | | | | 2.5 | 1.3 | — | 3.8 |
| No57 | 50.5 | 33.4 | 10.6 | | | | | 5.5 | | | | 0.66 | 24.5 | 67.2 | 8.3 | | | | | | | | | 2.2 | 1.2 | — | 3.4 |
| No58 | 68.5 | 17.6 | 7.9 | | | | 3 | | | | | 0.26 | 23.8 | 61.9 | 9.5 | | | | | | | | 3 | 1.9 | 1.5 | — | 3.4 |
| No59 | 63.4 | 27.1 | 9.5 | | | | | | | | | 0.43 | 25.7 | 64.2 | 10.1 | | | | | 4.2 | | | | 1.0 | 1.9 | 0.3 | 3.2 |
| No60 | 63.3 | 27.2 | 9.5 | | | | | | | | | 0.43 | 25.1 | 35.0 | 9.9 | | | | | | 9.3 | | | 1.1 | 1.8 | 0.2 | 3.1 |
| No61 | 59.1 | 25.3 | 15.6 | | | | | | | | | 0.43 | 25.7 | 64.2 | 10.1 | | | | | | | 4.8 | 4.8 | 1.1 | 1.2 | 1.0 | 3.3 |

FIG. 10

| TEST SAMPLE | FILM HARDNESS (HV0.025) | OXIDATION LAYER THICKNESS (μm) | CUTTING DISTANCE (m) | JUDGMENT | REMARKS |
|---|---|---|---|---|---|
| No27 | 2910 | 1.08 | 602 | × | CONVENTIONAL SAMPLE |
| No28 | 3270 | 0.33 | 973 | ○ | SAMPLE OF PRESENT INVENTION |
| No29 | 3250 | 0.31 | 921 | ○ | SAMPLE OF PRESENT INVENTION |
| No30 | 3240 | TOTAL OXIDATION | 452 | × | NG SAMPLE |
| No31 | 3190 | TOTAL OXIDATION | 786 | × | NG SAMPLE |
| No32 | 3250 | 0.33 | 902 | ○ | SAMPLE OF PRESENT INVENTION |
| No33 | 3240 | 0.31 | 953 | ○ | SAMPLE OF PRESENT INVENTION |
| No34 | 3240 | 0.32 | 972 | ○ | SAMPLE OF PRESENT INVENTION |
| No35 | 3220 | 0.32 | 901 | ○ | SAMPLE OF PRESENT INVENTION |
| No36 | 3190 | 0.32 | 893 | ○ | SAMPLE OF PRESENT INVENTION |
| No37 | | PEEL OFF | | × | NG SAMPLE |
| No38 | 3250 | 0.36 | 961 | ○ | SAMPLE OF PRESENT INVENTION |
| No39 | 3200 | 0.30 | 963 | ○ | SAMPLE OF PRESENT INVENTION |
| No40 | 3260 | 0.34 | 958 | ○ | SAMPLE OF PRESENT INVENTION |
| No41 | 3190 | 0.31 | 912 | ○ | SAMPLE OF PRESENT INVENTION |
| No42 | 3250 | 0.32 | 892 | ○ | SAMPLE OF PRESENT INVENTION |
| No43 | 3230 | 0.30 | 889 | ○ | SAMPLE OF PRESENT INVENTION |
| No44 | 3260 | 0.30 | 871 | ○ | SAMPLE OF PRESENT INVENTION |
| No45 | 3290 | 0.34 | 882 | ○ | SAMPLE OF PRESENT INVENTION |
| No46 | 3270 | 0.24 | 921 | ○ | SAMPLE OF PRESENT INVENTION |
| No47 | 3120 | 0.21 | 996 | ○ | SAMPLE OF PRESENT INVENTION |
| No48 | 3210 | 0.26 | 942 | ○ | SAMPLE OF PRESENT INVENTION |
| No49 | 3250 | 0.23 | 934 | ○ | SAMPLE OF PRESENT INVENTION |
| No50 | 3280 | 0.26 | 901 | ○ | SAMPLE OF PRESENT INVENTION |
| No51 | 3290 | 0.27 | 892 | ○ | SAMPLE OF PRESENT INVENTION |
| No52 | 3320 | 0.24 | 895 | ○ | SAMPLE OF PRESENT INVENTION |
| No53 | 3270 | 0.33 | 977 | ○ | SAMPLE OF PRESENT INVENTION |
| No54 | 3360 | 0.27 | 943 | ○ | SAMPLE OF PRESENT INVENTION |
| No55 | 3420 | 0.29 | 890 | ○ | SAMPLE OF PRESENT INVENTION |
| No56 | 3310 | 0.21 | 960 | ○ | SAMPLE OF PRESENT INVENTION |
| No57 | 3020 | 0.22 | 922 | ○ | SAMPLE OF PRESENT INVENTION |
| No58 | 3100 | 0.25 | 980 | ○ | SAMPLE OF PRESENT INVENTION |
| No59 | 3280 | 0.29 | 986 | ○ | SAMPLE OF PRESENT INVENTION |
| No60 | 3250 | 0.30 | 999 | ○ | SAMPLE OF PRESENT INVENTION |
| No61 | 3260 | 0.30 | 986 | ○ | SAMPLE OF PRESENT INVENTION |

FIG.11

| TOOL SHAPE | CEMENTED CARBIDE DRILL $\phi 6$ |
|---|---|
| WORK MATERIAL | S50C |
| CUTTING SPEED | 100 m/min |
| FEED RATE | 0.18 mm/rev |
| MACHINING DEPTH | 18 mm BLIND HOLE |
| CUTTING FLUID | MIST (EXTERNAL SUPPLY) |

FIG.12

| TEST SAMPLE | NUMBER OF MACHINED HOLES | JUDGMENT | REMARKS |
|---|---|---|---|
| No30 | 2000 | × | NG SAMPLE |
| No49 | 6020 | ○ | SAMPLE OF PRESENT INVENTION |
| No50 | 6060 | ○ | SAMPLE OF PRESENT INVENTION |
| No56 | 6230 | ○ | SAMPLE OF PRESENT INVENTION |
| No59 | 5010 | ○ | SAMPLE OF PRESENT INVENTION | ized.

HARD FILM AND HARD FILM COATED TOOL

TECHNICAL FIELD

The present invention relates to a hard film and particularly to a hard film excellent in abrasion resistance and heat resistance.

BACKGROUND ART

A hard film is widely applied to surfaces of predetermined members of tool base materials such as high-speed tool steel and cemented carbide. Heat resistance (oxidation resistance at high temperature) of film is extremely important for high-speed machining of high-hardness work material, for example, and has considerable effect on tool life. For example, TiAlN-based and AlCrN-based films are conventionally known as such a hard film excellent in heat resistance (see, e.g., Patent Documents 1 to 5).

PRIOR ART DOCUMENTS

Patent Documents

Patent Document 1: Japanese Laid-Open Patent Publication No. 2007-15106
Patent Document 2: Japanese Laid-Open Patent Publication No. 2007-119795
Patent Document 3: Japanese Laid-Open Patent Publication No. 2007-2332
Patent Document 4: Japanese Laid-Open Patent Publication No. 2006-307323
Patent Document 5: Japanese Laid-Open Patent Publication No. 2004-130514

SUMMARY OF THE INVENTION

Problem to be Solved by the Invention

However, cutting edges may be used under severe machining condition causing higher temperature of cutting edges due to further speeding up and efficiency increase in cutting work and hard films are required to be further improved in heat resistance. A used amount of cutting fluid is required to be reduced due to environmental concern; however, the reduction of used amount of cutting fluid tends to cause higher temperature of tools; and the improvement in heat resistance of the hard films is requested in this regard.

The present invention was conceived in view of the situations and it is therefore an object of the present invention to provide a hard film ensuring more excellent heat resistance.

Means for Solving the Problems

To achieve the object, the first aspect of the present invention provides a hard film excellent in abrasion resistance and heat resistance disposed on a surface of a predetermined member comprising:(a) a first film consisting of $Al_a Cr_b(SiC)_c \alpha_d N$ [where α denotes one or more elements of the groups IVa, Va, VIa (except Cr) of the periodic table of the elements, B, C, Si, and Y; a, b, c, and d are atom ratios within ranges of $0.35 \leq a \leq 0.76$, $0.12 \leq b \leq 0.43$, $0.05 \leq c \leq 0.20$, and $0 \leq d \leq 0.20$, respectively; a rate b/a of atom ratio of Cr to Al is within a range of $0.25 \leq b/a \leq 0.67$, which is aluminum-rich; and $a+b+c+d=1$ is satisfied], the first film disposed on a top surface, (b) the hard film having a total film thickness Ttotal within a range of 0.5 μm to 15 μm with a film thickness T1 of the first film or, if another film portion having the same film components as the first film is included, a film thickness including the film thickness T1 and the another film portion accounting for 20% or more of the total film thickness Ttotal.

The second aspect of the present invention provides the hard film recited in the first aspect of the present invention, wherein (a) the first film is directly disposed on a surface of the predetermined member and consists only of the first film, and wherein (b) the film thickness T1 of the first film is the total film thickness Ttotal.

The third aspect of the present invention provides the hard film recited in the first aspect of the present invention, wherein the hard film has a second film consisting of $Ti_e Al_f Cr_g \beta_h N$ [where β denotes one or more elements of the groups IVa, Va, VIa (except Ti, Cr) of the periodic table of the elements, B, C, Si, and Y; e, f, g, and h are atom ratios within ranges of $0 \leq e \leq 0.64$, $0.32 \leq f \leq 0.81$, $0 \leq g \leq 0.40$, and $0 \leq h \leq 0.20$, respectively; e and g are not zero at the same time; and $e+f+g+h=1$ is satisfied] and disposed on a surface of the predetermined member between the predetermined member and the first film.

The fourth aspect of the present invention provides the hard film recited in the third aspect of the present invention, wherein (a) the first film is directly disposed on the second film and the hard film consists only of the first film and the second film, and wherein (b) the film thickness T1 of the first film accounts for 20% or more of the total film thickness Ttotal.

The fifth aspect of the present invention provides the hard film recited in the third aspect of the present invention, wherein between the first film and the second film, the hard film has an interval layer made of an alternate layer having films of the same film components as the first film and the second film alternately stacked, or a mixed layer having the mixed film components of the first film and the second film.

The sixth aspect of the present invention is regarding a hard film coated tool, wherein having a surface of a tool base material coated with the hard film of any one of the first to fifth aspects of the present invention.

The Effects of the Invention

According to the hard film in the first aspect of the present invention, the first film consisting of $Al_a Cr_b(SiC)_c \alpha_d N$ formed by adding SiC (silicon carbide) at an atom ratio of 0.05 to 0.20 to an aluminum-rich AlCrN-based film having the rate b/a of atom ratio of Cr to Al within a range of $0.25 \leq b/a \leq 0.67$ is disposed on at least a top surface and the hard film with a film thickness T1 of the first film or, if another film portion having the same film components as the first film is included, a film thickness including the film thickness T1 and the another film portion accounts for 20% or more of the total film thickness Ttotal and, therefore, more excellent heat resistance (oxidation resistance at high temperature) is acquired while ensuring predetermined abrasion resistance. This enables, for example, high-efficiency machining such as high-load cutting with a greater cutting depth and cutting work under severe conditions that cause higher temperature of cutting edges such as high-speed cutting work to high hardness material, or extends the life of a tool in such cutting work, and enables reduction of a used amount of cutting fluid.

If α is added at an atom ratio equal to or less than 0.20, more excellent heat resistance is acquired. As a result, for example, under conditions that locally expose cutting edges (such as corners of a drill) to higher temperature for a long time such as high-speed cutting drilling work, excellent abrasion resistance and heat resistance are acquired, thereby improving the durability (tool life). That is, although in the end mill or the like which a load substantially uniformly acts on the cutting edges, no clear endurance improvement effect was recognized due to the addition of a, the durability is further improved in high-speed drilling work with a drill as compared to the case without addition of α.

Since the third aspect of the present invention is in the case having the second film consisting of $Ti_eAl_fCr_g\beta_hN$, which is tough and excellent in adherence, disposed on a surface of the predetermined member, the adherence of the hard film is improved and since the film thickness of the portion having the film components of the first film is equal to or greater than 20% of the total film thickness Ttotal, the heat-resistance improvement effect due to the film components of the first film is properly acquired. Therefore, for example, if high-speed cutting work is performed with dry machining (air blow) to high-hardness work material of 50 HRC or higher, the peeling of the film is suppressed and excellent abrasion resistance and heat resistance are properly acquired. If β is added at an atom ratio equal to or less than 0.20, more excellent heat resistance is acquired from the second film. For example, although a TiAl compound may have poor oxidation resistance because the oxidation of Ti is faster than the oxidation of Al, the addition of β can be expected to decrease the oxygen vacancy concentration of Ti oxide and reduce the growth rate thereof. As a result, a uniform Al oxide layer is facilitated, thereby ensuring the oxidation resistance.

Since the fifth aspect of the present invention is in the case disposed with the interlayer consisting of the alternate layer having the films of the same film components as the first film and the second film alternately stacked or the mixed layer having the mixed film components of the first film and the second film between the first film and the second film, the adhesive property of the first film is further improved and the toughness of the overall film is improved. As a result, the peeling of the surface layer is suppressed even in processing a difficult-to-machine material (hard tough material) and stable machining performance is acquired for a long time, thereby improving the tool life.

Since the sixth aspect of the present invention is regarding a hard film coated tool, wherein the case having a surface of a tool base material coated with the hard film of any one of the first to fifth aspects of the present invention, substantially, the same action effect as the hard film in the first to fifth aspects of the present invention is acquired.

BRIEF DESCRIPTION OF THE DRAWINGS

FIG. 1 is a diagram depicting a ball end mill to which the present invention is applied; (a) is a front view in a direction orthogonal to a shaft center; (b) is an enlarged bottom view from the leading end side; (c) is an enlarged cross-section view in the vicinity of the surface of the cutting portion disposed with the hard film.

FIG. 2 is a diagram for explaining the difference between AlCr(SiC)N and AlCrSiCN; (a) is a conceptual diagram of an atomic structure of AlCr(SiC)N; (b) is a conceptual diagram of an atomic structure of AlCrSiCN; (c) is a diagram for explaining an act of Si in AlCrSiCN.

FIG. 4 is a diagram for explaining other embodiments of the present invention; both (a) and (b) are cross-section views corresponding to FIG. 1(c).

FIG. 5 is a diagram for explaining further embodiments of the present invention; both (a) and (b) are cross-section views corresponding to FIG. 1(c).

MODES FOR CARRYING OUT THE INVENTION

The present invention is preferably applied to hard films disposed on surfaces of various working tools including rotary cutting tools such as end mill, tap, and drill, non-rotary cutting tools such as tool bit, or rolling tools and is also applicable to hard films disposed on surfaces of members other than working tools, such as surface protection films of semiconductor devices etc. Although cemented carbide, high-speed tool steel, alloy tool steel, cermet, ceramics, polycrystalline diamond (PCD), single-crystalline diamond, polycrystalline CBN, and single-crystalline CBN are preferably used as tool base materials of hard film coated tools, other tool materials are employable.

An arc ion plating method, a sputtering method, and a PVD method (physical vapor deposition method) such as a PLD (Pulse LASER Deposition) method are preferably used for a means of forming a hard film. With regard to Al, Cr, Ti, SiC (silicon carbide), α, β, etc., constituting the hard film, these individual metals, alloys, etc., can be used as a target to execute a film formation process; however, alloys etc., of $Al_aCr_b$, $Al_aCr_b\alpha_d$, $Ti_eAl_f$, $Ti_eAl_fCr_g$, $Ti_eAl_f\beta_h$, and $Ti_eAl_fCr_g\beta_h$ can be used as a target to execute the film formation process. N (nitrogen) can be added by supplying reaction gas. C (carbon) is an option of α and β and can be added by supplying reaction gas (such as carbon hydride gas) or by a solid target (C-target, C-containing target). A constituent element of a first film, "(SiC)" in parentheses indicates the presence in the first film in the form of a compound that is silicon carbide.

Although a hard film coated tool is preferably used under machining conditions causing higher temperature of cutting edges, for example, in dry cutting work at higher speed and higher load and high-speed cutting work for high-hardness work material and ensures excellent durability (tool life), the hard film coated tool may naturally be used under processing conditions requiring less abrasion resistance and heat resistance, for example, in cutting work using cutting fluid.

Both β of the first film and β of a second film have atom ratios d, h including zero and are arbitrarily added; the first film may be $Al_aCr_b(SiC)_cN$ [where a+b+c=1]; and the second film may be $Ti_eAl_fCr_gN$ [where e+f+g=1]. If α or β is added, atom ratios a to d are defined to satisfy a relationship of a+b+c+d=1, and atom ratios e to h are defined to satisfy a relationship of e+f+g+h=1. If both α and β are added, α=β or α≠β may be satisfied.

Although the atom ratios e and g of Ti and Cr of the second film include zero, these atom ratios e and g are not zero at the same time, and the second film is configured to include at least one of Ti and Cr. Both Ti and Cr may be contained at predetermined atom ratios. In other words, TiAlβN or AlCrβN may be used for the second film, in addition to TiAlCrβN.

A total film thickness Ttotal of the hard film is within a range of 0.5 μm to 15 μm; in the case of less than 0.5 μm, the performance of the hard film is not sufficiently acquired; and, in the case of greater than 15 μm, tool performance may deteriorate due to rounding etc., of cutting edges of cutting tools. If a film thickness including the first film and other film portions having the same film components as the first film is less than 20% relative to the total film thickness Ttotal, the effect of improving heat resistance due to the film components of the first film is not sufficiently acquired and, therefore, the film thickness is set equal to or greater than 20%. Other film portions having the same film components as the first film are assumed to include, for example, an alternate layer having a film of the same film components as the first film and the other film alternately stacked, or a mixed layer having the film components of the first film mixed with other film components; in the case of the alternate layer, a total film thickness of the film portions of the same film components as the first film is included; and in the case of the mixed layer, an overall film thickness thereof is included. It is more desirable that a film thickness T1 of the first film located at the top surface solely accounts for 20% or more of the total film thickness Ttotal.

Although the second film is disposed between a predetermined member and the first film in the third aspect of the invention and an interlayer is further disposed between the second film and the first film in the fifth aspect of the invention, the first aspect of the present invention may be implemented such that at least the first film is located at the top surface; the hard film can be made up only of the first film as in the second aspect of the present invention; and another foundation layer having a component different from the second film may be disposed between the predetermined member and the first film. Two or more types of films different from the second film or the interlayer may be disposed between the predetermined member and the first film, and various forms can be implemented on condition that a total film thickness of the first film and the portion having the same film components as the first film is equal to or greater than 20% relative to the total film thickness Ttotal of the hard film In the implementation of the third aspect of the invention, a hard film is employable that has a multilayer structure having films of the same film components as the second film and the first film alternately stacked. In this case, a film thickness acquired by adding the film thickness T1 to the total film thickness of the films having the same film components as the first film may be set equal to or greater than 20% of the total film thickness Ttotal.

Although the interlayer of the fifth aspect of the invention is made up of an alternate layer having films of the same film components as the first film and the second film alternately stacked, or a mixed layer having the mixed film components of the first film and the second film, the alternate layer may have the films of the same film components as the first film and the second film alternately stacked at least for one period; the both films may have the same or different thicknesses; and, therefore, the number of stacking periods and the respective film thickness are set as needed. The mixed layer includes all the components of the first film and the second film and can be formed by using all the targets and reaction gases used in the film formation processes of the first film and the second film. Although the film thickness of the interlayer is set as needed such that a sum of a film thickness of the portion having the same film components as the first film in the interlayer (the overall film thickness in the case of the mixed layer or the total film thickness of the films having the same film components as the first film in the case of alternate layer) and the film thickness T1 of the first film accounts for 20% or more of the total film thickness Ttotal, the film thickness T1 of the first film at the top surface may solely account for 20% or more of the total film thickness Ttotal. An alternate layer employed as the interlayer can have a multilayer structure having films of the same film components as the first film and the second film alternately stacked for one or more periods with the mixed layer or another film interposed therebetween.

First Embodiment

Embodiments of the present invention will now be described in detail with reference to the drawings.

Figure 1A:
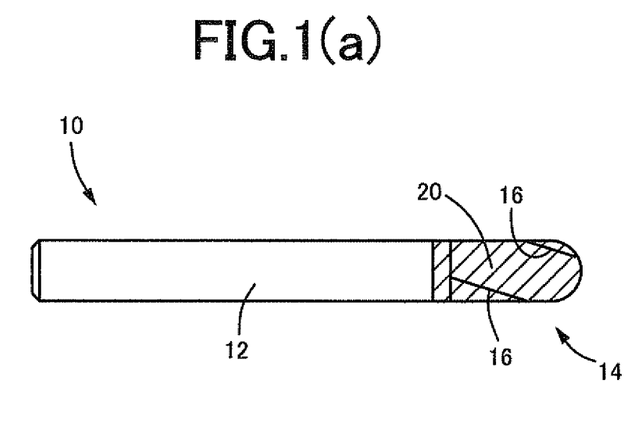
Figure 1B:
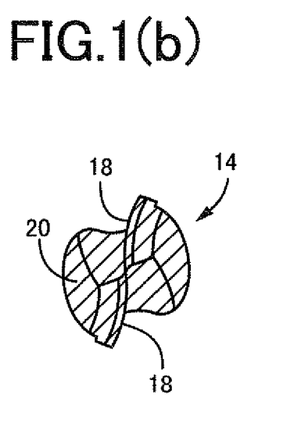
Figure 1C:
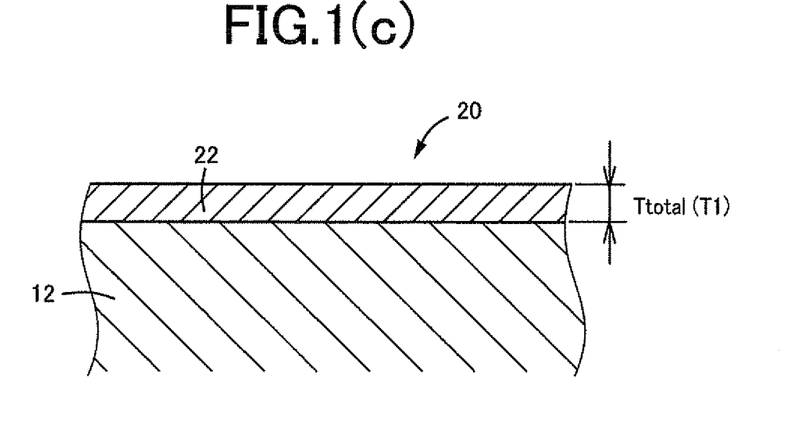

FIG. 1 is a diagram for explaining a ball end mill 10 that is an example of a hard film coated tool to which the present invention is applied; (a) is a front view in a direction orthogonal to a shaft center; (b) is an enlarged bottom view from the leading end side (the right side of the view of (a)); a tool base material 12 made of cemented carbide or high-speed tool steel is integrally disposed with a cutting portion 14 continued from a shank. The cutting portion 14 is disposed with pairs of peripheral cutting edges 16 and ball cutting edges 18 as cutting edges symmetrically to the shaft center and is rotationally driven around the shaft center to perform cutting work with the peripheral cutting edges 16 and the ball cutting edges 18, and the surface of the cutting portion 14 is coated with a hard film 20. A shaded portion of FIG. 1(a) represents the hard film 20 and FIG. 1(c) is a cross-section view in the vicinity of the surface of the cutting portion 14 coated with the hard film 20. The ball end mill 10 is a rotary cutting tool and the tool base material 12 corresponds to a predetermined member disposed with the hard film 20.

As can be seen from FIG. 1(c), the hard film 20 is a single-layer film consisting only of a first film 22 directly disposed on the surface of the tool base material 12. The first film 22 is made of $Al_aCr_b(SiC)_c\alpha_dN$ [where α denotes one or more elements of the groups IVa, Va, VIa (except Cr) of the periodic table of the elements, B, C, Si, and Y; a, b, c, and d are atom ratios within ranges of $0.35 \leq a \leq 0.76$, $0.12 \leq b \leq 0.43$, $0.05 \leq c \leq 0.20$, and $0 \leq d \leq 0.20$, respectively; a rate b/a of atom ratio of Cr to Al is within a range of $0.25 \leq b/a \leq 0.67$, which is aluminum-rich; and a+b+c+d=1 is satisfied], and the film is formed by using an arc ion plating apparatus with a predetermined target and a reaction gas. A film thickness T1 of the first film 22, i.e., a total film thickness Ttotal of the hard film 20 is within a range of 0.5 to 15 μm.

Figure 7:
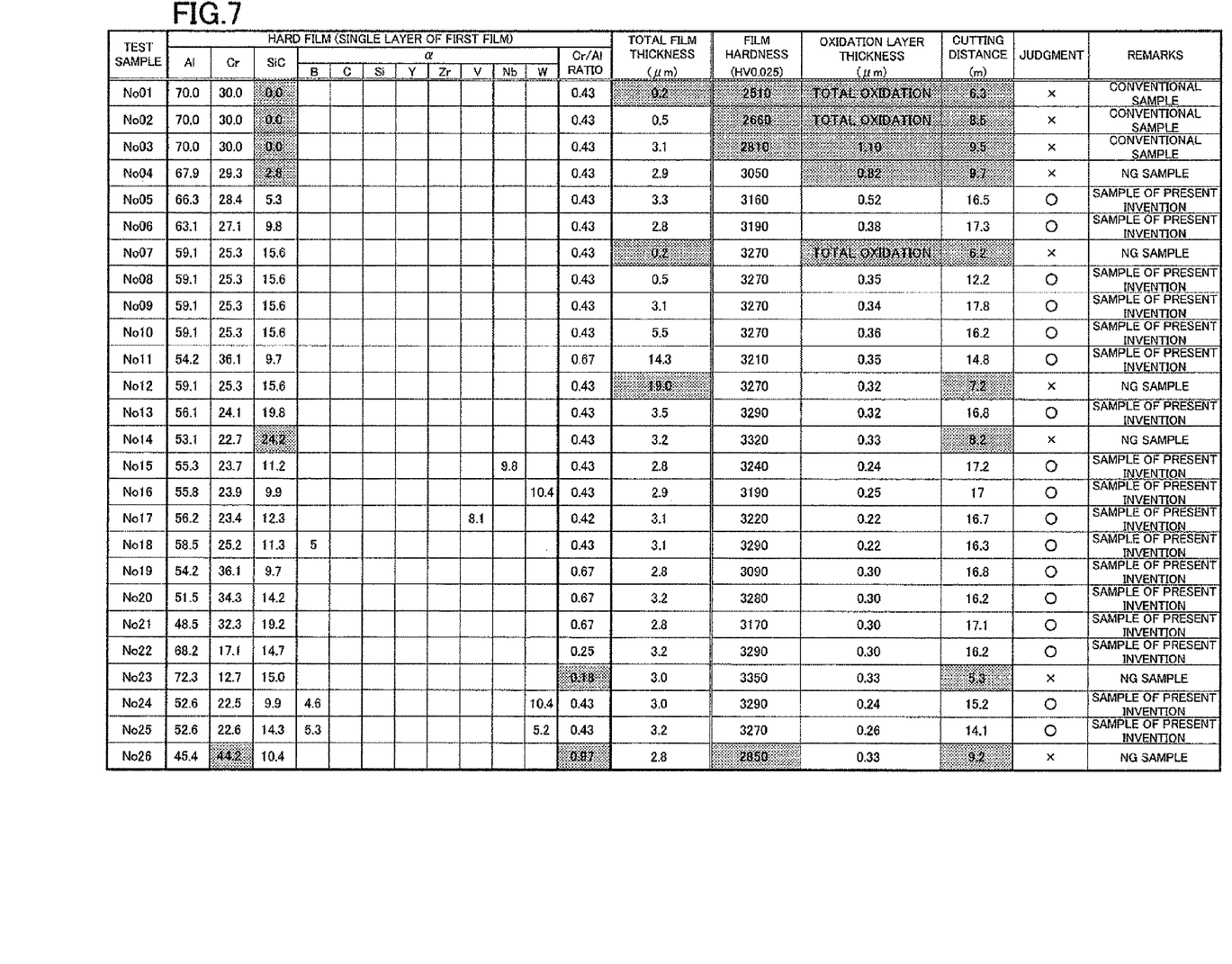
FIG. 7 specifically depicts film compositions and the film thickness of the test samples used in the durability test of FIG. 6 and is a diagram for explaining the test result for the durability test and the heat resistance test or the like of FIG. 6.

Hard films indicated by the test sample Nos. 5, 6, 8 to 11, 13, 15 to 22, 24, and 25 depicted in FIG. 7 are specific examples of the hard film 20 of this embodiment.

Figure 2A:
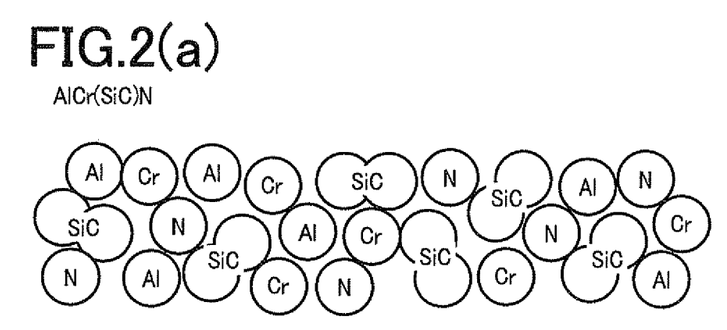
Figure 2B:
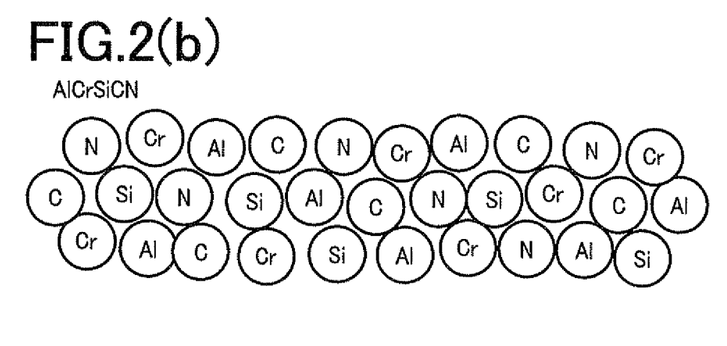
Figure 2C:
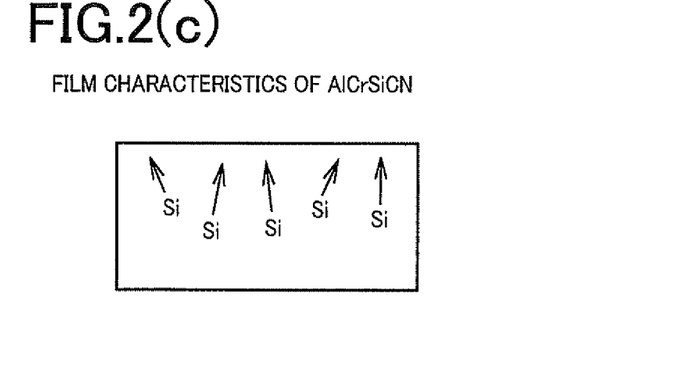

A constituent element of the first film 22, "(SiC)" means the presence in the first film 22 in the form of a compound that is silicon carbide and, because of the addition of SiC (silicon carbide) at an atom ratio of 0.05 to 0.20, excellent heat resistance (oxidation resistance at high temperature) is acquired while ensuring predetermined abrasion resistance. FIG. 2(a) is a conceptual diagram of an atomic structure when a has the atom ratio d=0 in the first film 22 of this embodiment, i.e., an atomic structure of AlCr(SiC)N, and SiC is present in the form of a compound. In contrast, in the case of AlCrSiCN, Si and C are separately present as depicted in FIG. 2(b). When Si and C are separately present in AlCrSiCN in this way, since Si easily combines with oxygen, Si concentrates on an oxygen-rich surface as depicted in FIG. 2(c) and Si combines with oxygen to form silicon oxide on the surface, thereby achieving the excellent oxidation resistance (heat resistance).

Figure 3:
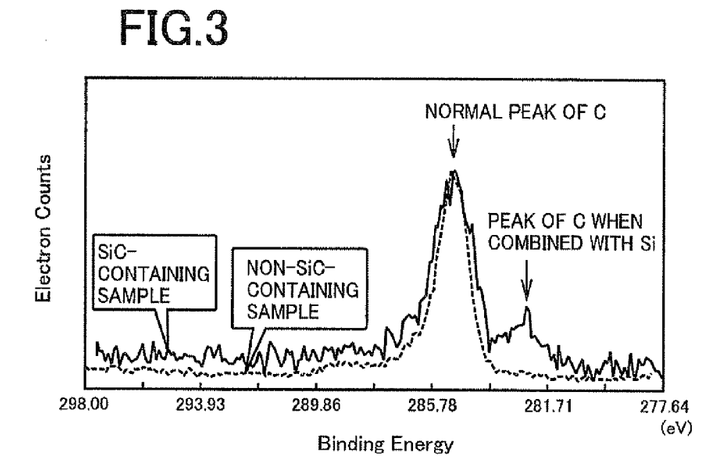
FIG. 3 is a diagram of comparison of measurement results from XPS between SiC-containing sample which SiC is contained as a compound and non-SiC-containing sample which SiC is not contained as a compound.

However, since Si is lost from the film, the density of Si is reduced in the film, deteriorating the abrasion resistance. On the other hand, in the case of AlCr(SiC)N, since the binding with oxygen is reduced due to the presence in the form of the compound that is SiC and the atom migration of Si toward the surface does not occur, the oxidation resistance can be improved while maintaining predetermined abrasion resistance. The presence of SiC in the film can be determined from a measurement result of XPS (X-ray Photoelectron Spectrometry). FIG. 3 is a diagram of comparison of measurement results from XPS between when SiC is contained as a compound (SiC-containing sample) and when SiC is not contained as a compound (non-SiC-containing sample), and the SiC-containing sample has a peak near 282 eV and whether SiC is contained in the form of a compound can be determined from presence of this peak.

The hard film 20 of the ball end mill 10 of this embodiment is made up of the first film 22 consisting of $Al_aCr_b(SiC)_c\alpha_dN$ formed by adding SiC (silicon carbide) at an atom ratio of 0.05 to 0.20 to an aluminum-rich AlCrN-based film having the rate b/a of atom ratio of Cr to Al within a range of $0.25 \leq b/a \leq 0.67$ and, therefore, more excellent heat resistance (oxidation resistance at high temperature) is acquired while ensuring predetermined abrasion resistance. This enables, for example, high-efficiency machining such as high-load cutting with a greater cutting depth and cutting work under severe conditions that cause higher temperature of cutting edges such as high-speed cutting work to high hardness material, or extends the life of a tool in such cutting work, and enables reduction of a used amount of cutting fluid.

If α is added at an atom ratio equal to or less than 0.20 (e.g., test samples Nos. 15 to 18, 24, and 25 of FIG. 7), more excellent heat resistance is acquired. As a result, for example, under conditions that locally expose cutting edges (such as corners of a drill) to higher temperature for a long time such as high-speed cutting drilling work, excellent abrasion resistance and heat resistance are acquired, thereby improving the durability (tool life). If a load substantially uniformly acts on the ball cutting edges 18 as in the case of the ball end mill 10 of this embodiment, no clear endurance improvement effect was recognized due to the addition of α.

Second Embodiment

Other embodiments of the present invention will then be described. The portions common to the following embodiments and the first embodiment will be denoted by the same reference numerals and will not be described in detail.

Figure 4A:
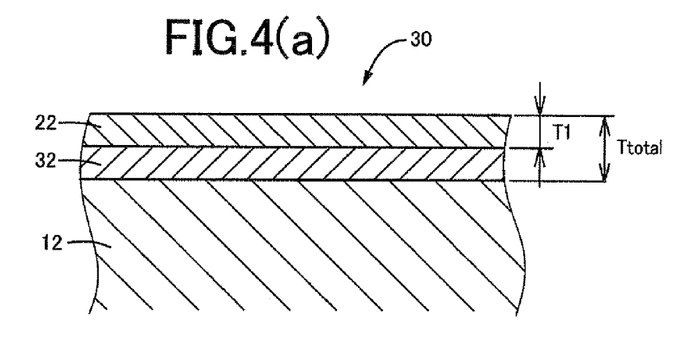

A hard film 30 of FIG. 4(a) has a second film 32 interposed between the tool base material 12 and the first film 22. The second film 32 is made of $Ti_eAl_fCr_g\beta_hN$ [where β denotes one or more elements of the groups IVa, Va, VIa (except Ti, Cr) of the periodic table of the elements, B, C, Si, and Y; e, f, g, and h are atom ratios within ranges of $0 \leq e \leq 0.64$, $0.32 \leq f \leq 0.81$, $0 \leq g \leq 0.40$, and $0 \leq h \leq 0.20$, respectively; e and g are not zero at the same time; and e+f+g+h=1 is satisfied], and the film is formed by using an arc ion plating apparatus with a predetermined target and a reaction gas as is the case with the first film 22. The total film thickness Ttotal of the hard film 30 in this case is within a range of 0.5 to 15 μm as is the case with the hard film 20, and the film thickness T1 of the first film 22 is equal to or greater than 20% of the total film thickness Ttotal and the rest is the film thickness of the second film 32.

Figure 9:
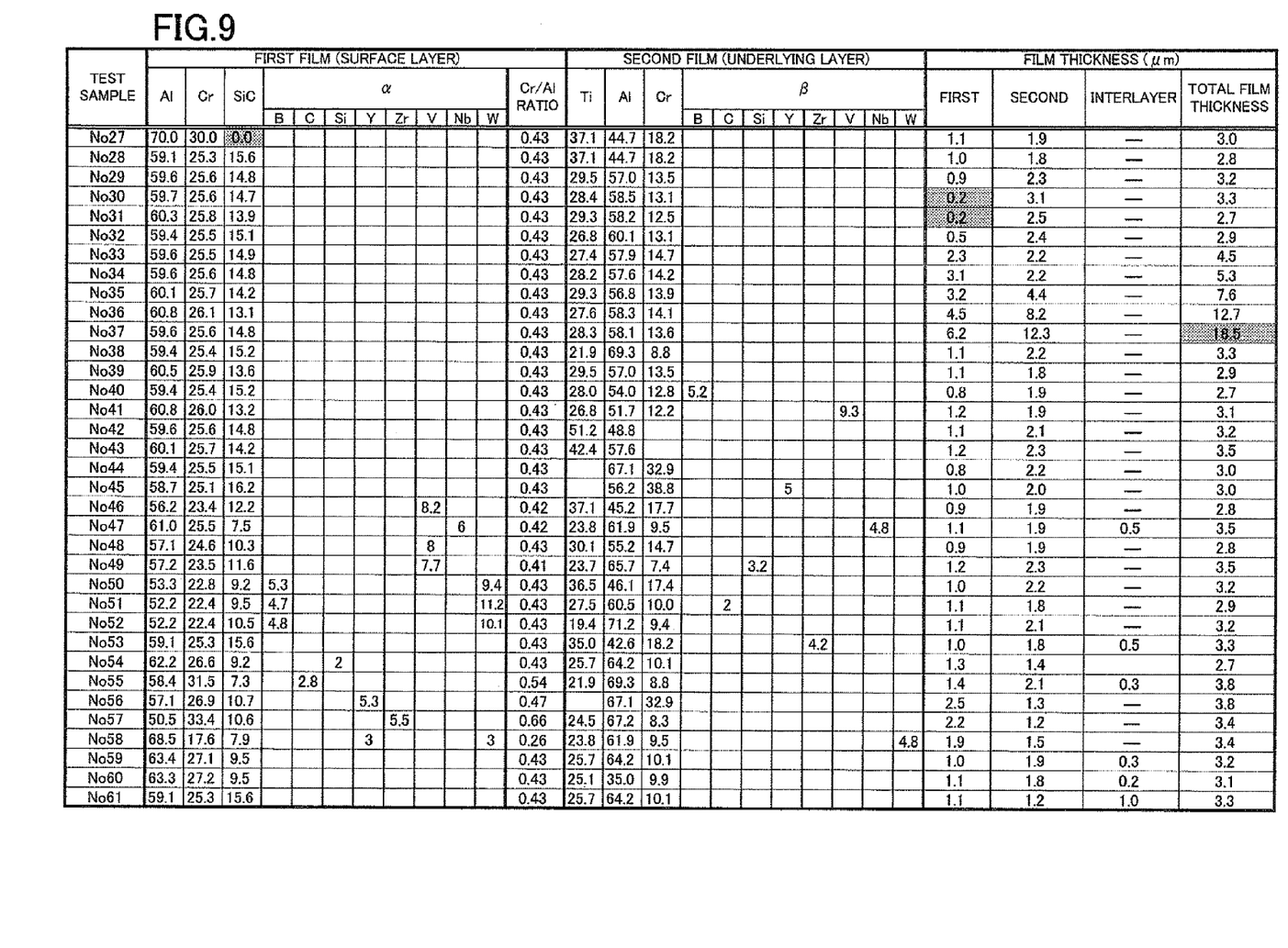
FIG. 9 is a diagram specifically depicting film compositions and the film thickness of the test samples used in the durability test of FIG. 8.

Hard films indicated by the test sample Nos. 28, 29, 32 to 36, 38 to 46, 48 to 52, 54, and 56 to 58 depicted in FIG. 9 are specific examples of the hard film 30 of this embodiment.

Since the hard film 30 of this embodiment has the second film 32 consisting of $Ti_eAl_fCr_g\beta_hN$, which is tough and excellent in adherence, disposed between the tool base material 12 and the first film 22, the adherence of the hard film 30 is improved and since the film thickness T1 of the first film 22 is equal to or greater than 20% of the total film thickness Ttotal, the heat-resistance improvement effect due to the first film 22 is properly acquired. Therefore, for example, if high-speed cutting work is performed with dry machining (air blow) to high-hardness work material of 50 HRC or higher, the peeling of the film is suppressed and excellent abrasion resistance and heat resistance are properly acquired. If β is added at an atom ratio equal to or less than 0.20, more excellent heat resistance is acquired from the second film 32.

Third Embodiment

Figure 4B:
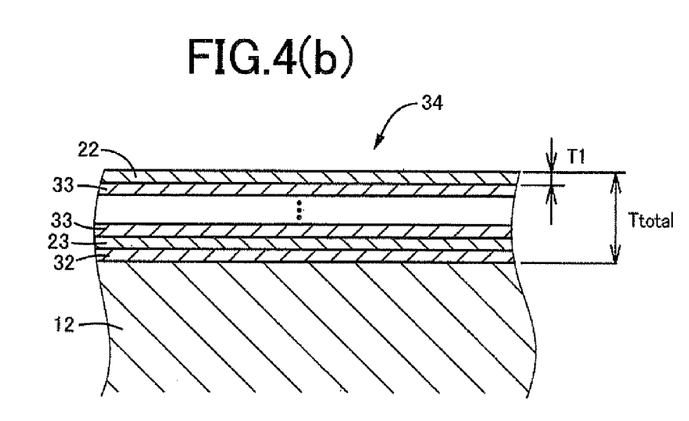

A hard film 34 of FIG. 4(b) is a film of multilayer structure having a pair of films 23, 33 of the film components equivalent to the first film 22 and the second film 32 alternately stacked for one or more periods (a plurality of periods in the embodiment) between the first film 22 and the second film 32 and has the second film 32 and the first film 22 alternately stacked on the tool base material 12 such that the first film 22 is substantially defined as the top surface. The total film thickness Ttotal of the hard film 34 is within a range of 0.5 to 15 μm, and film thicknesses are determined such that a film thickness acquired by adding the film thickness T1 of the first film 22 to the total film thickness of a plurality of the films 23 equivalent to the film components of the first film 22 accounts for 20% or more of the total film thickness Ttotal. Although the film thicknesses of the films 22, 23, 32, and 33 are substantially the same as each other in FIG. 4(b), the film thicknesses can be set as needed such as setting the film thickness T1 of the first film 22 greater than the film thicknesses of the other films 23, 32, and 33.

In the hard film 34 of this embodiment, the second film 32 is disposed on the tool base material 12 and, therefore, the same action effect as the hard film 30 is acquired. Since the hard film 34 has the multilayer structure with a pair of the films 23, 33 of the film components equivalent to the first film 22 and the second film 32 alternately stacked for one or more periods between the first film 22 and the second film 32, the adhesive property of the first film 22 is further improved and the toughness of the overall hard film 34 is improved. Since a film thickness acquired by adding the film thickness T1 of the first film 22 to the total film thickness of a plurality of the films 23 equivalent to the film components of the first film 22 accounts for 20% or more of the total film thickness Ttotal, the heat-resistance improvement effect due to the film components of the first film 22 is properly acquired. The film portion of the multilayer structure having a pair of films 23, 33 of the film components equivalent to the first film 22 and the second film 32 alternately stacked for one or more periods corresponds to the interlayer (the alternate layer in this embodiment).

Fourth Embodiment

Figure 5A:
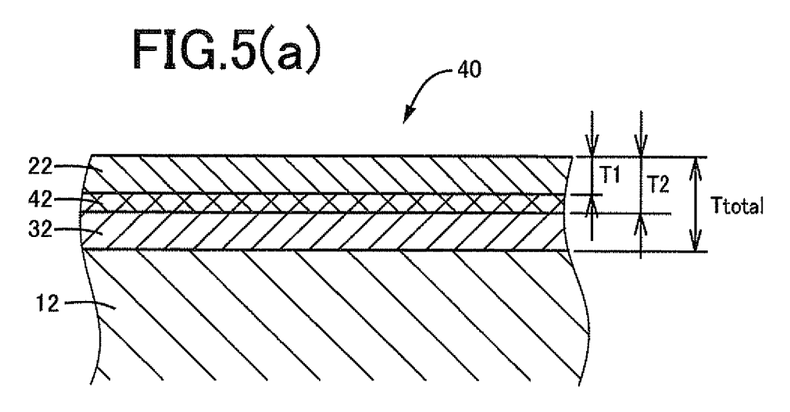

A hard film 40 of FIG. 5(a) represents the case that an interlayer 42 is further disposed between the first film 22 and the second film 32 of the hard film 30 of the second embodiment. The interlayer 42 is an alternate layer having films of the same film components as the first film 22 and the second film 32 alternately stacked, or a mixed layer having the mixed film components of the first film 22 and the second film 32, and the mixed layer is disposed as the interlayer 42 in this embodiment. This mixed layer contains all the components of the first film 22 and the second film 32 and is formed by using all the targets and reaction gases used in the film formation processes of the first film 22 and the second film 32; the interlayer 42 can continuously be formed following the film formation process of the second film 32; and the first film 22 can further continuously be formed. The total film thickness Ttotal of the hard film 40 is within a range of 0.5 to 15 μm; a film thickness T2 acquired by combining the first film 22 and the interlayer (in the case of the mixed layer) 42 accounts for 20% or more of the total film thickness Ttotal; and the rest is the film thickness of the second film 32. Although the film thickness of the interlayer 42 is set as needed such that the film thickness T2 accounts for 20% or more of the total film thickness Ttotal, the film thickness T1 of the first film 22 located at the top surface may solely account for 20% or more of the total film thickness Ttotal.

Among the test samples depicted in FIG. 9, hard films indicated by the test sample Nos. 47, 53, 55, and 59 to 61 having a numerical value (film thickness) entered in an item "INTERMEDIATE" of an item "FILM THICKNESS (μm)" are specific examples of the hard film 40 of this embodiment. All of these examples have the film thickness of the interlayer 42 smaller than each of the film thicknesses of the first film 22 and the second film 32.

Since the hard film 40 of this embodiment is disposed with the interlayer 42 consisting of the alternate layer having the films of the same film components as the first film 22 and the second film 32 alternately stacked or the mixed layer having the mixed film components of the first film 22 and the second film 32 between the first film 22 and the second film 32, the adhesive property of the first film 22 is further improved and the toughness of the overall hard film 40 is improved. Since the film thickness T2 acquired by combining the interlayer (in the case of the mixed layer) 42 and the first film 22 accounts for 20% or more of the total film thickness Ttotal, the heat-resistance improvement effect due to the film components of the first film 22 is properly acquired. If the interlayer 42 is the alternate layer, a film thickness acquired by adding the film thickness T1 of the first film 22 to a total film thickness of the film portion of the same film components as the first film 22 may be set equal to or greater than 20% of the total film thickness Ttotal. As a result, the peeling of the surface layer is suppressed even in processing a difficult-to-machine material (hard tough material) and stable machining performance is acquired for a long time, thereby improving the tool life.

Fifth Embodiment

Figure 5B:
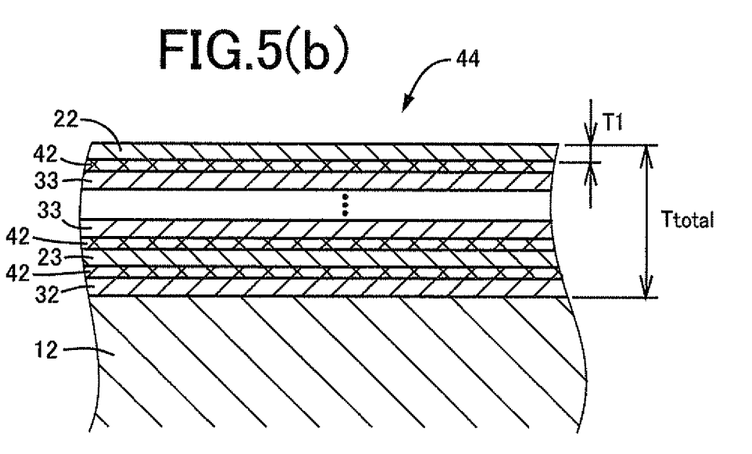

A hard film 44 of FIG. 5(b) is a film of multilayer structure having a pair of the films 23, 33 of the film components equivalent to the first film 22 and the second film 32 alternately stacked to sandwich the interlayer 42 for one or more periods (a plurality of periods in the embodiment) between the first film 22 and the second film 32 and has the second film 32 and the first film 22 alternately stacked with the interlayer 42 interposed therebetween on the tool base material 12 such that the first film 22 is substantially defined as the top surface. The total film thickness Ttotal of the hard film 44 is within a range of 0.5 to 15 μm, and film thicknesses are determined such that a film thickness acquired by adding the film thickness T1 of the first film 22 to the total film thickness of a plurality of the films 23 equivalent to the film components of the first film 22 and the interlayers 42 consisting of the mixed layer accounts for 20% or more of the total film thickness Ttotal. Although the film thicknesses of the films 22, 23, 32, 33, and 42 are substantially the same as each other in FIG. 5(b), the film thicknesses can be set as needed such as setting the film thickness T1 of the first film 22 greater than the film thicknesses of the other films 23, 32, 33, and 42. In this embodiment, the interlayer 42 is disposed between a pair of the films 23, 33 and, therefore, the same action effect as the hard film 40 is acquired and, additionally, due to the multilayer structure having the films 23, 33 alternately stacked to sandwich the interlayer 42 for one or more periods, the adhesive property and the toughness are further improved. As described above, the film of the multilayer structure having a pair of the films 23, 33 of the film components equivalent to the first film 22 and the second film 32 alternately stacked to sandwich the interlayer 42 for one or more periods is one form of the alternate layer.

Test Result 1

Figure 6A:
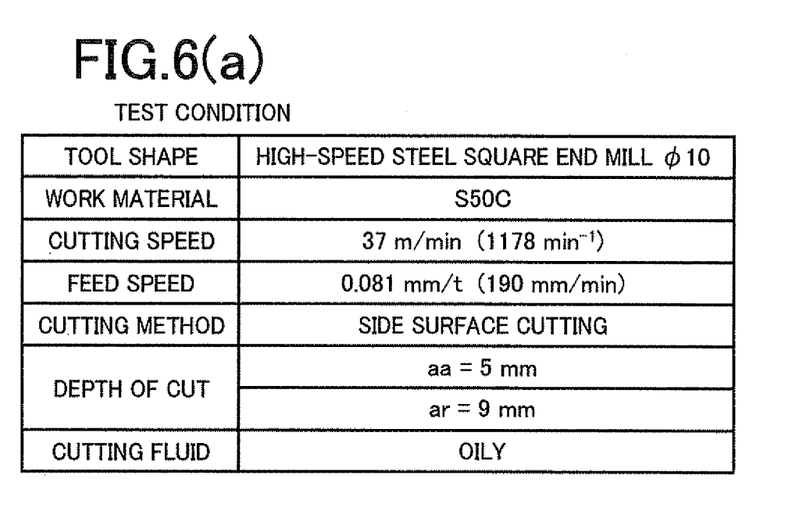
FIG. 6 is a view for explaining the test condition in the case that a durability test is performed to a plurality of types of test samples including samples of the present invention and conventional samples.
Figure 6B:
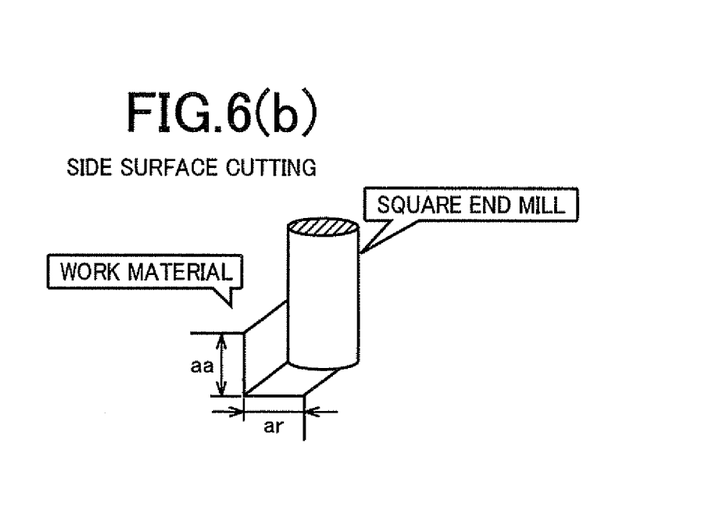

For a two-bladed square end mill having a tool base material of ingot high-speed steel (high-speed tool steel) and a diameter of 10 mm, description will be made of results of measurement of film hardness (HV 0.025) as well as a heat resistance test and a durability test performed by preparing a plurality of types of test samples Nos. 01 to 26 including samples of the present invention disposed with the hard film 20 of the first embodiment consisting a single layer of the first film 22 as depicted in FIG. 7. A test sample with film hardness less than 3000 is considered as NG (rejected). In the heat resistance test, the test samples were exposed to 1000° C. in atmospheric pressure/air atmosphere for one hour before measuring an oxidation layer thickness. If the hard film is completely oxidized, i.e., in the case of total oxidation, and even if the oxidation layer thickness is equal to or greater than 0.7 μm, the test sample is considered as NG. In the durability test, side surface cutting work is performed for carbon steel (S50C defined in JIS) under the test condition depicted in FIG. 6 to obtain a cutting distance before a cutting edge flank wear width reaches 0.2 mm and, if the cutting distance is less than 10 m, the test sample is considered as NG.

The test samples Nos. 01 to 03 of FIG. 7 are conventional samples of AlCrN-based hard film containing no SiC; the test samples Nos. 05, 06, 08 to 11, 13, 15 to 22, 24, and 25 are samples of the present invention; and the remaining test samples Nos. 04, 07, 12, 14, 23, and 26 are comparative samples (NG samples) not satisfying the requirements of the present invention in terms of the atom ratio and Cr/Al ratio (=b/a) of film compositions and the total film thickness Ttotal. A shaded (dotted) field of items "HARD FILM" and "TOTAL FILM THICKNESS" of FIG. 7 indicates an item departed from the requirements of the present invention, and a shaded (dotted) field of items "FILM HARDNESS", "OXIDATION LAYER THICKNESS", and "CUTTING DISTANCE" indicates NG. Film compositions in fields of "HARD FILM" of FIG. 7 are atom ratios described as percentage. Although no description is made of N (nitrogen), the hard films of all the test samples are nitride containing N (nitrogen).

As can be seen from the test result of FIG. 7, each of the samples of the present invention (test sample Nos. 05, 06, 08 to 11, 13, 15 to 22, 24, and 25) has film hardness equal to or greater than 3000, ensuring excellent film hardness as compared to the conventional samples (test sample Nos. 01 to 03). Each of the samples of the present invention (test sample Nos. 05, 06, 08 to 11, 13, 15 to 22, 24, and 25) has an oxidation layer thickness in the heat resistance test equal to or less than 0.6 μm and satisfies the acceptable requirement (less than 0.7 μm) and, particularly, the test samples Nos. 15 to 18, 24, and 25 containing α have oxidation layer thicknesses less than 0.3 μm, ensuring more excellent heat resistance. Each of the samples of the present invention (test sample Nos. 05, 06, 08 to 11, 13, 15 to 22, 24, and 25) has a cutting distance equal to or greater than 10 m when the flank wear width is 0.2 mm in the durability test, and satisfies the acceptable requirement while both the conventional samples (test sample Nos. 01 to 03) and the comparative samples (test sample Nos. 04, 07, 12, 14, 23, and 26) have cutting distance less than 10 m and, therefore, the samples of the present invention ensure excellent durability.

Test Result 2

Figure 8A:
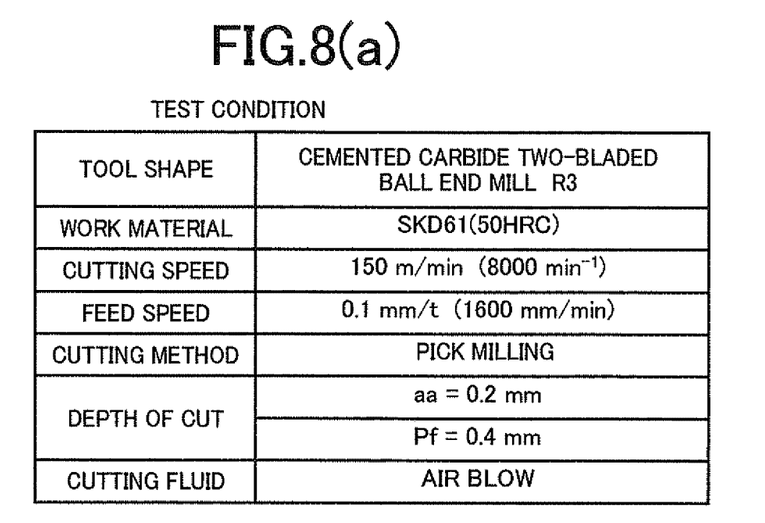
FIG. 8 is a diagram for explaining the test condition in the case that a durability test which is different from that of FIG. 6 is performed to a plurality of types of test samples including samples of the present invention and conventional samples.
Figure 8B:
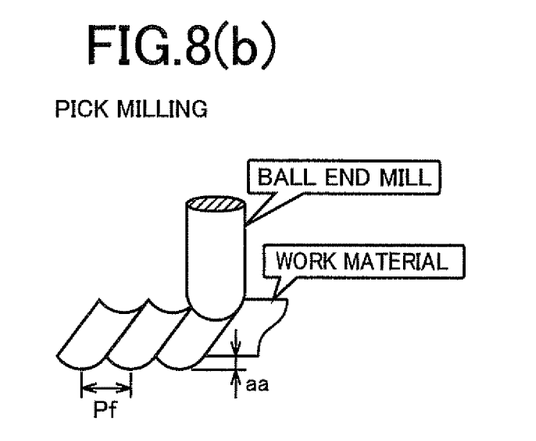
Figure 10:
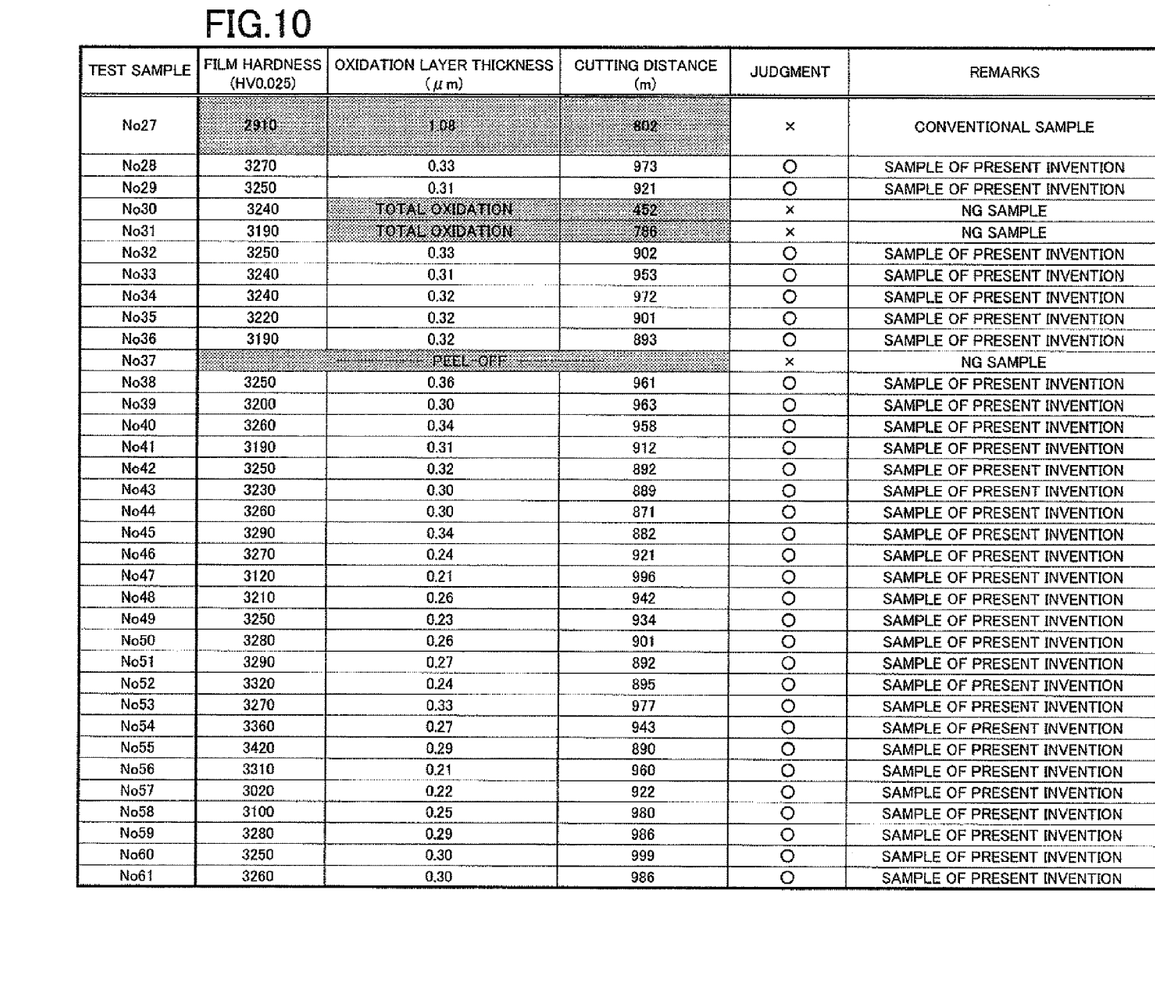
FIG. 10 is a diagram for explaining the test result for the durability test and the heat resistance test or the like of FIG. 8 with respect to the test samples of FIG. 9.

FIGS. 9 and 10 are diagrams for explaining results of measurement of film hardness (HV 0.025) as well as a heat resistance test and a durability test performed for a two-bladed ball end mill having a tool base material of cemented carbide and a diameter of 6 mm (tip radius R=3 mm) by preparing a plurality of types of test samples Nos. 27 to 61 including samples of the present invention disposed with the hard film 30 of the second embodiment consisting of the first film 22 and the second film 32 or the hard film 40 of the fourth embodiment disposed with the interlayer 42 between the first film 22 and the second film 32. A test sample with film hardness less than 3000 is considered as NG (rejected). In the heat resistance test, as in the case of FIG. 7, the test samples were exposed to 1000° C. in atmospheric pressure/air atmosphere for one hour before measuring an oxidation layer thickness. If the hard film is completely oxidized, i.e., in the case of total oxidation, and even if the oxidation layer thickness is equal to or greater than 0.7 μm, the test sample is considered as NG. In the durability test, dry cutting work (pick milling) with air blow is performed for high-hardness alloy tool steel (SKD61 (50HRC) defined in JIS) under the test condition depicted in FIG. 8 to obtain a cutting distance before a cutting edge flank wear width reaches 0.1 mm and, if the cutting distance is less than 850 m, the test sample is considered as NG.

The test sample No. 27 of FIG. 9 is a conventional sample with the first film consisting of AlCrN-based hard film containing no SiC; the test samples Nos. 30, 31, and 37 are comparative samples (NG samples) not satisfying the requirements of the present invention in terms of the total film thickness Ttotal and a rate of the film thickness T1 of the first film relative to the total film thickness Ttotal. The remaining test samples Nos. 28, 29, 32 to 36, 38 to 61 are samples of the present invention; among them, the test samples Nos. 28, 29, 32 to 36, 38 to 46, 48 to 52, 54, and 56 to 58 are specific example of the hard film 30 without the interlayer 42; and the test samples Nos. 47, 53, 55, and 59 to 61 are specific example of the hard film 40 having the interlayer 42. A shaded (dotted) field of items. "FIRST FILM" and "FILM THICKNESS" of FIG. 9 indicates an item departed from the requirements of the present invention, and a shaded (dotted) field of items "FILM HARDNESS", "OXIDATION LAYER THICKNESS", and "CUTTING DISTANCE" of FIG. 10 indicates NG. Film compositions in fields of "HARD FILM" of FIG. 9 are atom ratios described as percentage. Although no description is made of N (nitrogen), the hard films of all the test samples are nitride containing N (nitrogen).

As can be seen from the test result of FIG. 10, each of the samples of the present invention (test sample Nos. 28, 29, 32 to 36, 38 to 61) has film hardness equal to or greater than 3000, ensuring excellent film hardness as compared to the conventional samples (test sample No. 27). Each of the samples of the present invention (test sample Nos. 28, 29, 32 to 36, 38 to 61) has an oxidation layer thickness in the heat resistance test equal to or less than 0.4 μm and satisfies the acceptable requirement (less than 0.7 μm) and, particularly, the test samples Nos. 46 to 52 and 54 to 58 containing α in the first film have oxidation layer thicknesses less than 0.3 μm, ensuring more excellent heat resistance. Each of the samples of the present invention (test sample Nos. 28, 29, 32 to 36, 38 to 61) has a cutting distance equal to or greater than 850 m when the flank wear width is 0.1 mm in the durability test, and satisfies the acceptable requirement while both the conventional sample (test sample No. 27) and the comparative samples (test samples Nos. 30 and 31) have cutting distance less than 850 m and, therefore, the samples of the present invention ensure excellent durability. In this test result, no remarkable difference is recognized due to the presence of the interlayer 42. For the comparative sample of the test sample No. 37 having the total film thickness Ttotal of 18.5 μm, the measurement of film hardness, the heat resistance test, and the durability test could not properly be performed because of the peeling of the film.

Test Result 3

Figure 11:
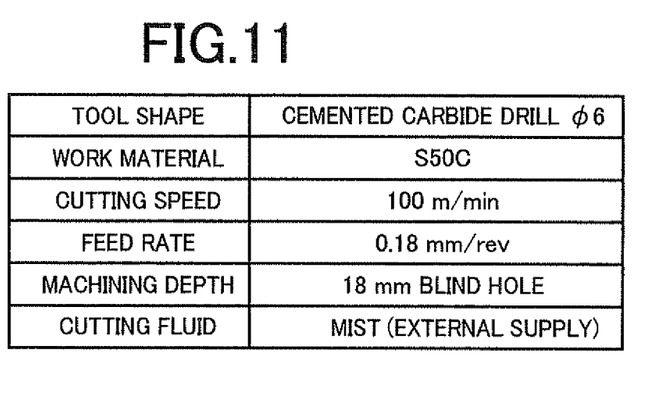
FIG. 11 is a diagram for explaining the test condition in the case that a durability test of a drill coated with the same hard film as the test samples Nos. 30, 49, 50, 56 and 59 of FIG. 9 is performed.
Figure 12:
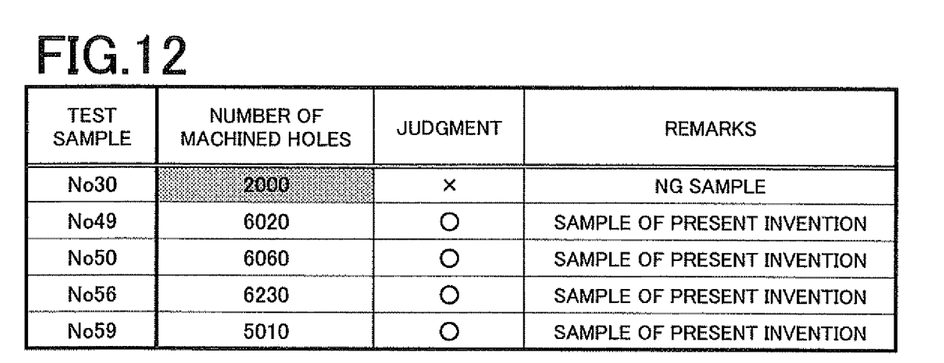
FIG. 12 is a diagram for explaining the test result for the durability test of FIG. 11.

FIG. 12 is a diagram for explaining a result of a durability test performed for a cemented carbide drill having a tool base material of cemented carbide and a diameter of 6 mm by preparing five test samples disposed with the same hard films as the test samples Nos. 30, 49, 50, 56 and 59 of FIG. 9 to perform high-speed cutting drilling work with mist oil supply for carbon steel (S50C defined in JIS) under the test condition depicted in FIG. 11. In the durability test, the number of machined holes is obtained before a cutting edge flank wear width reaches 0.2 mm and, if the number of machined holes is less than 4000, the test sample is considered as NG. The test sample No. 30 of FIG. 12 is a comparative sample with the film thickness T1 of the first film less than 20% of the total film thickness Ttotal and the other test samples Nos. 49, 50, 56, and 59 are samples of the present invention. A shaded (dotted) field of an item "MACHINED HOLE NUMBER" of FIG. 12 indicates NG.

As can be seen from the test result of FIG. 12, each of the samples of the present invention (test sample Nos. 49, 50, 56, and 59) enables drilling of 5000 holes or more while the comparative sample of the test sample No. 30 has 2000 holes and, therefore, the samples of the present invention significantly improve the durability. Particularly, since the test samples Nos. 49, 50, and 56 containing a in the first film have the number of machined holes equal to or greater than 6000 while the test sample No. 59 without a in the first film has 5010 holes, the addition of a to the first film significantly increases the number of machined holes.

Although the embodiments of the present invention have been described in detail with reference to the drawings, the embodiments are merely exemplary embodiments and the present invention can be implemented in variously modified and improved forms based on the knowledge of those skilled in the art.

10: ball end mill (hard film coated tool) 12: tool base material (predetermined member) 20, 30, 34, 40, 44: hard film 22: first film 23: film having the same film components as the first film 32: second film 33: film having the same film components as the second film 42: interlayer Ttotal: total film thickness of the hard film 20 T1: film thickness of the first film 22 T2: film thickness acquired by combining the interlayer 42 and the first film 22

The invention claimed is:

1. A hard film excellent in abrasion resistance and heat resistance disposed on a surface of a predetermined member comprising:
a first film consisting of $Al_aCr_b(SiC)_c\alpha_dN$ [where α denotes one or more elements of the groups IVa, Va, VIa (except Cr) of the periodic table of the elements, B, C, Si, and Y; a, b, c, and d are atom ratios within ranges of $0.35 \leq a \leq 0.76$, $0.12 \leq b \leq 0.43$, $0.05 \leq c \leq 0.20$, and $0 \leq d \leq 0.20$, respectively; a rate b/a of atom ratio of Cr to Al is within a range of $0.25 \leq b/a \leq 0.67$, which is aluminum-rich; and $a+b+c+d=1$ is satisfied], the first film disposed on a top surface, the hard film having a total film thickness Ttotal within a range of 0.5 μm to 15 μm with a film thickness T1 of the first film or, if another film portion having the same film components as the first film is included, a film thickness including the film thickness T1 and the another film portion accounting for 20% or more of the total film thickness Ttotal.

2. The hard film of claim 1, wherein
the first film is directly disposed on a surface of the predetermined member and consists only of the first film, and wherein
the film thickness T1 of the first film is the total film thickness Ttotal.

3. The hard film of claim 1, wherein
the hard film has a second film consisting of $Ti_eAl_fCr_g\beta_hN$ [where β denotes one or more elements of the groups IVa, Va, VIa (except Ti, Cr) of the periodic table of the elements, B, C, Si, and Y; e, f, g, and h are atom ratios within ranges of $0 \leq e \leq 0.64$, $0.32 \leq f \leq 0.81$, $0 \leq g \leq 0.40$, and $0 \leq h \leq 0.20$, respectively; e and g are not zero at the same time; and $e+f+g+h=1$ is satisfied] and disposed on a surface of the predetermined member between the predetermined member and the first film.

4. The hard film of claim 3, wherein
the first film is directly disposed on the second film and the hard film consists only of the first film and the second film, and wherein
the film thickness T1 of the first film accounts for 20% or more of the total film thickness Ttotal.

5. The hard film of claim 3, wherein
between the first film and the second film, the hard film has an interval layer made of an alternate layer having films of the same film components as the first film and the second film alternately stacked, or a mixed layer having the mixed film components of the first film and the second film.

6. A hard film coated tool having a surface of a tool base material coated with the hard film of claim 1.

7. A hard film coated tool having a surface of a tool base material coated with the hard film of claim 2.

8. A hard film coated tool having a surface of a tool base material coated with the hard film of claim 3.

9. A hard film coated tool having a surface of a tool base material coated with the hard film of claim 4.

10. A hard film coated tool having a surface of a tool base material coated with the hard film of claim 5.

* * * * *